United States Patent
Franke et al.

(10) Patent No.: US 10,748,769 B2
(45) Date of Patent: Aug. 18, 2020

(54) METHODS AND SYSTEMS FOR PATTERNING OF LOW ASPECT RATIO STACKS

(71) Applicant: Tokyo Electron Limited, Minato-ku, Tokyo (JP)

(72) Inventors: Elliott Franke, Albany, NY (US); Angelique Raley, Albany, NY (US); Sophie Thibaut, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/407,042

(22) Filed: May 8, 2019

(65) Prior Publication Data

US 2019/0348288 A1 Nov. 14, 2019

Related U.S. Application Data

(60) Provisional application No. 62/669,084, filed on May 9, 2018.

(51) Int. Cl.
*H01L 21/033* (2006.01)
*H01L 21/311* (2006.01)
(Continued)

(52) U.S. Cl.
CPC ...... *H01L 21/0338* (2013.01); *H01L 21/0276* (2013.01); *H01L 21/02274* (2013.01); *H01L 21/0335* (2013.01); *H01L 21/0337* (2013.01); *H01L 21/31116* (2013.01); *H01L 21/31144* (2013.01); *H01L 21/67069* (2013.01)

(58) Field of Classification Search
CPC ................................................... H01L 21/0338
See application file for complete search history.

(56) References Cited

U.S. PATENT DOCUMENTS 9,412,609 B1 * 8/2016 Nagabhirava ..... H01L 21/31105
2011/0039413 A1 2/2011 Akinmade-Yusuff et al.
(Continued)

FOREIGN PATENT DOCUMENTS

JP 2005347560 A 12/2005

OTHER PUBLICATIONS

International Search Report and Written Opinion in PCT/US2019/031373 dated Aug. 20, 2019, 11 pages.

*Primary Examiner* — Roberts P Culbert
(74) *Attorney, Agent, or Firm* — Rothwell, Figg, Ernst & Manbeck, P.C.

(57) ABSTRACT

Embodiments of methods and systems for patterning of low aspect ratio stacks are described. In one embodiment, a method may include receiving a substrate comprising a patterned organic planarizing layer (OPL) mask wherein a surface of the OPL mask is exposed, the OPL mask landing on a dielectric layer. The method may also include performing a partial etch of the dielectric layer in a region exposed by the OPL mask. Additionally, the method may include depositing a capping material on a surface of the OPL mask. The method may also include performing a cyclical process of the partial etch of the dielectric layer and deposition of the capping material on a surface of the OPL mask until the dielectric layer is removed to a target depth. In such embodiments, the cyclical process generates an output patterned substrate with a target line edge roughness (LER).

20 Claims, 6 Drawing Sheets (51) Int. Cl.
*H01L 21/67* (2006.01)
*H01L 21/027* (2006.01)
*H01L 21/02* (2006.01)

(56) References Cited

U.S. PATENT DOCUMENTS

2012/0244458 A1 9/2012 Luong et al.
2014/0024219 A1 1/2014 Jung et al.
2016/0314985 A1 10/2016 Yang et al.

* cited by examiner

*FIG. 6B*

METHODS AND SYSTEMS FOR PATTERNING OF LOW ASPECT RATIO STACKS

CROSS-REFERENCE TO RELATED APPLICATIONS

This application is related to and claims priority to U.S. Provisional Patent Application Ser. No. 62/669,084 filed on May 9, 2018, the entire contents of which are herein incorporated by reference.

BACKGROUND OF THE INVENTION

Field of Invention

The present invention relates to systems and methods for substrate processing, and more particularly to methods and systems for patterning of low aspect ratio stacks.

Description of Related Art

The described embodiments relate to formation of features in low aspect ratio stacks having one or more organic layers. A common material stack used in lithography or other processing techniques in silicon-based device formation includes a bulk silicon or glass substrate. Layers of insulators, such as silicon nitrides or silicon oxides may be formed on the substrate. Further layers of silicon, such as amorphous silicon (aSi) layers, metals, and the like may be formed on the insulator layers. Organic layers, such as an organic planarization layer (OPL) may be formed on the further layers of silicon or metal. Antireflective coatings, such as silicon antireflective coating (SiARC) may be deposited on the OPL layer. One or more patterned layers formed of spin-on masking materials, such as photoresist, may be deposited and patterned on the SiARC layer.

Processing of features in material stacks, such as those described above, requires careful control of etch processes to control dimensions and fidelity of the features. To enhance fidelity of features, it is helpful to prevent processing errors. Unfortunately, low frequency line edge roughness (LER) or wiggle that occurs in processing of organic films, such as the OPL described above.

SUMMARY

Embodiments of methods and systems for patterning of low aspect ratio stacks are described. In one embodiment, a method may include receiving a substrate comprising a patterned organic planarizing layer (OPL) mask wherein a surface of the OPL mask is exposed, the OPL mask landing on a dielectric layer. The method may also include performing a partial etch of the dielectric layer in a region exposed by the OPL mask. Additionally, the method may include depositing a capping material on a surface of the OPL mask. The method may also include performing a cyclical process of the partial etch of the dielectric layer and deposition of the capping material on a surface of the OPL mask until the dielectric layer is removed to a target depth. In such embodiments, the cyclical process generates an output patterned substrate with a target line edge roughness (LER).

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Methods and systems for patterning low aspect ratio stacks are described. In an embodiment, such methods may be used to create features in low aspect ratio stacks, and thereby reduce LER and/or wiggle in features formed in organic films and dielectric materials.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Figure 1:
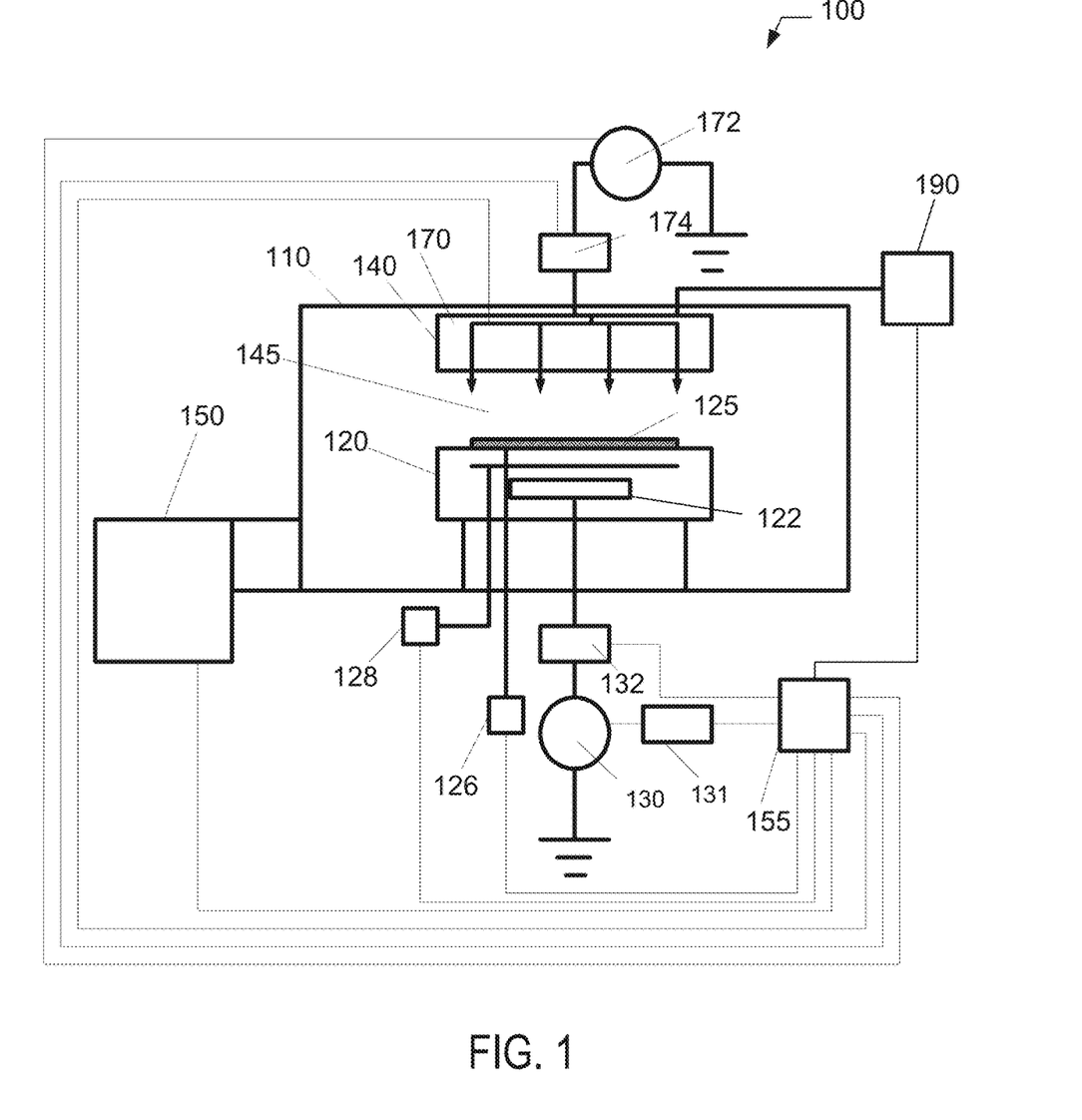
FIG. 1 illustrates one embodiment of a system for patterning low aspect ratio stacks.

FIG. 1 is an embodiment of a system 100 for patterning low aspect ratio stacks. In a further embodiment, the system may be configured to perform patterning of low aspect ratio stacks as described with reference to FIGS. 2-6B. An etch and plasma-assisted deposition system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the processing system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as an RIE reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to processing system 100 as well as monitor outputs from plasma processing system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of processing system 100 according to a process recipe in order to perform a plasma assisted process, such as a plasma etch process or a post heating treatment process, on wafer 125.

In addition, the processing system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2:
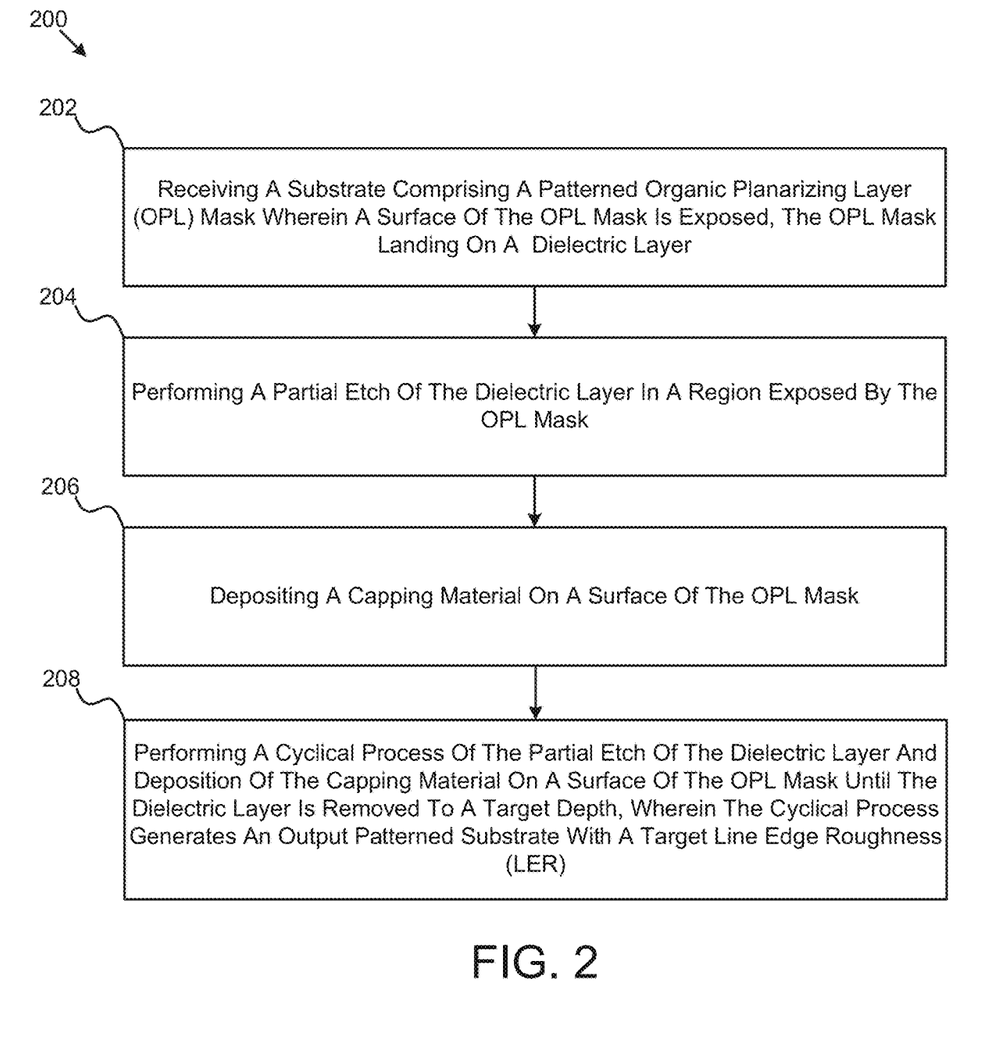
FIG. 2 illustrates one embodiment of a method for patterning low aspect ratio stacks.

FIG. 2 illustrates an embodiment of a method 200 for patterning of low aspect ratio stacks are described. In one embodiment, the method 200 may include receiving a substrate comprising a patterned organic planarizing layer (OPL) mask wherein a surface of the OPL mask is exposed, the OPL mask landing on a dielectric layer as shown at block 202. The method 200 may also include performing a partial etch of the dielectric layer in a region exposed by the OPL mask as shown at block 204. Additionally, the method 200 may include depositing a capping material on a surface of the OPL mask as shown at block 206. The method 200 may also include performing a cyclical process of the partial etch of the dielectric layer and deposition of the capping material on a surface of the OPL mask until the dielectric layer is removed to a target depth as shown at block 208. In such embodiments, the cyclical process generates an output patterned substrate with a target line edge roughness (LER). In an embodiment, features in the incoming workpiece may have an LER in a range of 1.8 nm to 2.5 nm. In an embodiment, the LER may be reduced by approximately twenty percent (20%) to a range of 1.44 nm to 2 nm. In an embodiment, line width roughness (LWR) of features in an incoming workpiece may be in a range of 2.5 nm to 3.5 nm. In an embodiment, LWR may be reduced by up to forty percent (40%) to a range of 1.5 nm to 2.1 nm. One of ordinary skill will recognize that these ranges may vary depending upon the application, target feature requirements, and processing requirements. Actual ranges may be determined by empirical testing or during processing of the workpiece.

Figure 3A:
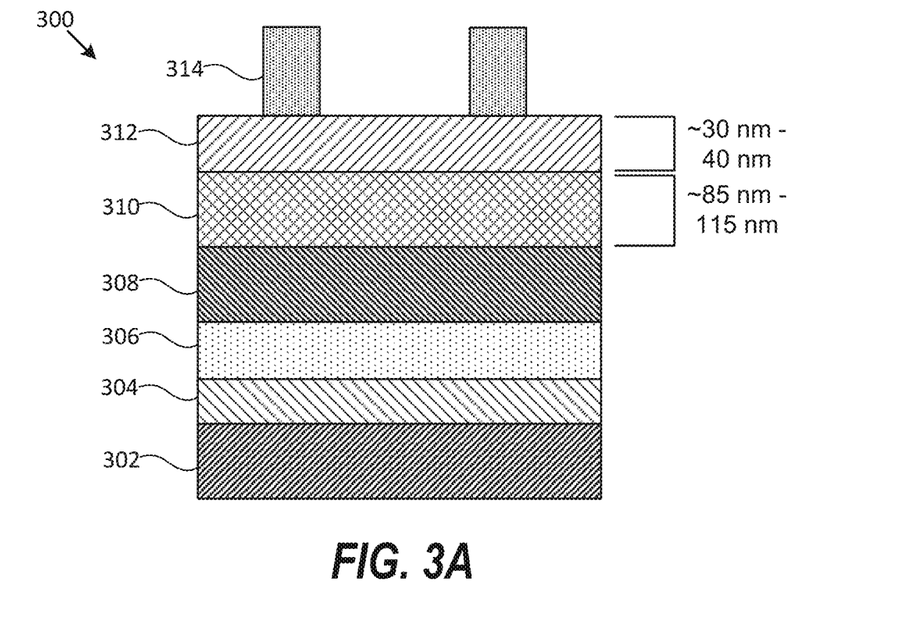
FIG. 3A is a cross-section diagram illustrating one embodiment of a layered workpiece having a high aspect ratio.
Figure 3B:
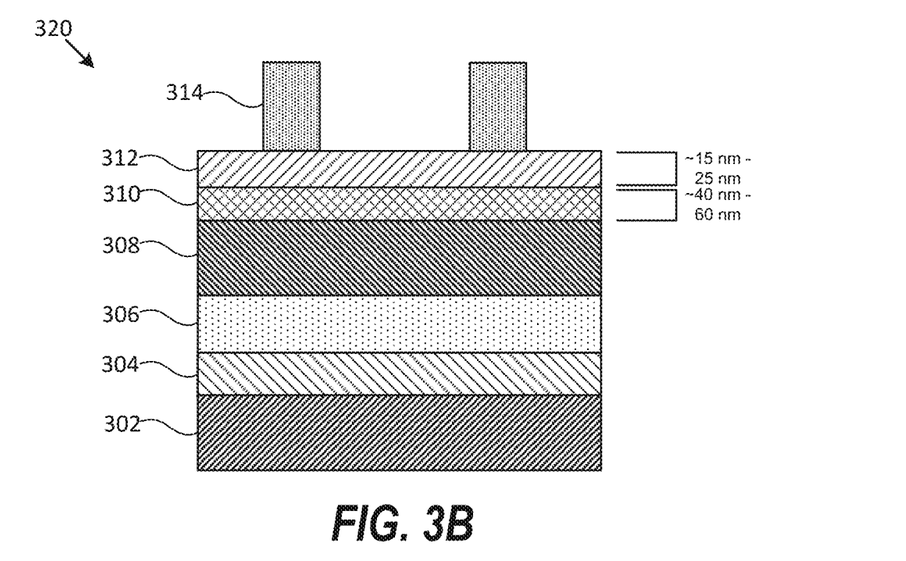
FIG. 3B is a cross-section diagram illustrating one embodiment of a layered workpiece having a low aspect ratio.

FIGS. 3A and 3B illustrate embodiments of lithography stacks that include organic layers. FIG. 3A illustrates an embodiment with a relatively high aspect ratio, and FIG. 3B illustrates an embodiment with a relatively low aspect ratio. In an embodiment, the high aspect ratio stack 300 of FIG. 3A includes a substrate 302. The substrate 302 may be formed of silicon, glass, germanium, or the like. A first insulator layer 304 may be formed on the substrate 302. In a further embodiment, a second insulator layer 306 may be formed on the first insulator layer 304. In one embodiment, the first insulator layer 304 may be formed of a nitride material, such as silicon nitride (SiN). In one such embodiment, the thickness of the first insulator layer may be in a range of 30 nm to 40 nm. In such an embodiment, the second insulator layer 306 may be formed of an oxide material, such as $SiO_x$. The second insulator layer 306 may have a thickness in a range of 40 nm to 60 nm. One of ordinary skill will recognize that the materials of the first insulator layer 304 and the second insulator layer 306 may be different, depending upon the application. For example, the materials may be reversed, where the material of the first insulator layer 304 is an oxide, and the material of the second insulator layer 306 is a nitride.

In an embodiment, a dielectric layer 308 may be disposed on at least one of the first insulator layer 304 and the second insulator layer 306. In an embodiment, the dielectric layer 308 is silicon or silicon-based. For example, in one embodiment, the dielectric layer 308 is amorphous silicon (a-Si). In an embodiment, the dielectric layer 308 may have a thickness in a range of 85 nm to 115 nm.

In an embodiment, the high aspect ratio stack 300 may include an organic layer 310. The organic layer 310 may comprise materials commonly found in an OPL. Such materials may include spin-on-carbon, spin-on-glass, or the like. Other deposition methods, including chemical vapor deposition (CVD) or the like may be used to deposit the organic layer 310. In the embodiment of FIG. 3A, the organic layer 310 may have a thickness in a range of 85 nm to 115 nm. By comparison, the low aspect ratio stack 320 illustrated in FIG. 3B may include an organic layer having a thickness in a range of 40 nm to 60 nm.

In an embodiment, the high aspect ratio stack 300 may include an anti-reflective layer 312. In an embodiment, the anti-reflective layer 312 may include a Silicon Anti-Reflective Coating (SiARC) material. The anti-reflective layer 312 may be a single layer of material, or may be a composite of multiple layers of anti-reflective material. In the embodiment of FIG. 3A, the high aspect ratio stack 300 may include an anti-reflective layer 312 having a thickness in a range of 30 nm to 40 nm. By contrast, the low aspect ratio stack 320 of FIG. 3B may include an anti-reflective layer 312 having a thickness in a range of 15 nm to 25 nm.

In an embodiment, a patterned mask 314 may be formed on a surface of the anti-reflective layer 312. The patterned mask 314 may include a patternable polymer, such as photoresist, or the like.

The specific materials and thicknesses described with reference to FIGS. 3A and 3B are for illustrative purposes only, and are not intended to limit the scope of the present embodiments. One of ordinary skill will recognize that a greater or lesser number of layers may be used, that the materials may be changed or reordered, and that the thicknesses of each layer may vary, depending upon the specific applications for which the stack is to be used.

Figure 4A:
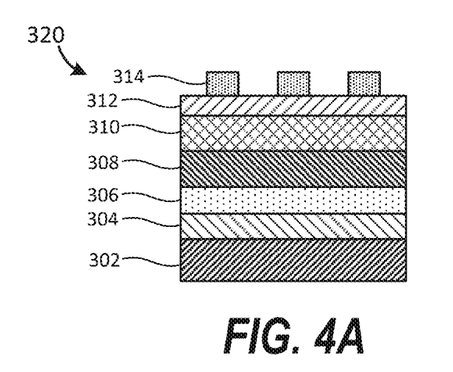
FIG. 4A is a cross-section diagram illustrating one embodiment a workflow for patterning low aspect ratio stacks.
Figure 4B:
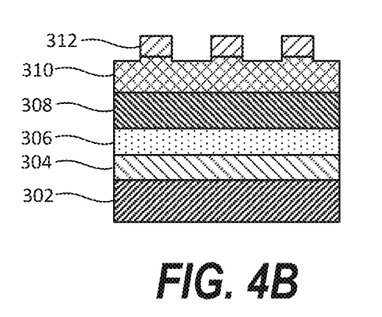
FIG. 4B is a cross-section diagram illustrating one embodiment a workflow for patterning low aspect ratio stacks.

FIGS. 4A-4E illustrate an embodiment of a processing flow for patterning of low aspect ratio stacks. As illustrated in FIG. 4A, the processing flow may include receiving a workpiece having a low aspect ratio stack 320, such as the embodiment illustrated in FIG. 3B. In a first etch process, the anti-reflective layer 312 may be etched in a region exposed by the patterned mask 314. During etch of the anti-reflective layer 312, the patterned mask 314 may be removed.

Figure 4C:
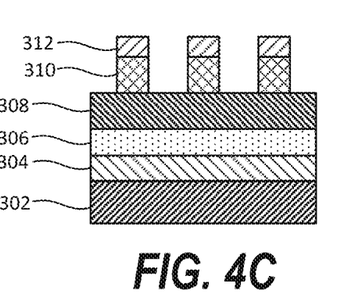
FIG. 4C is a cross-section diagram illustrating one embodiment a workflow for patterning low aspect ratio stacks.
Figure 4D:
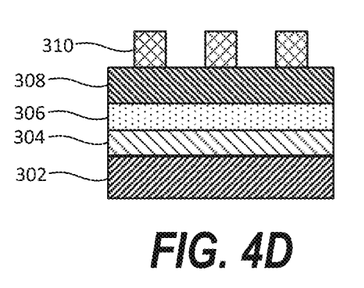
FIG. 4D is a cross-section diagram illustrating one embodiment a workflow for patterning low aspect ratio stacks.
Figure 4E:
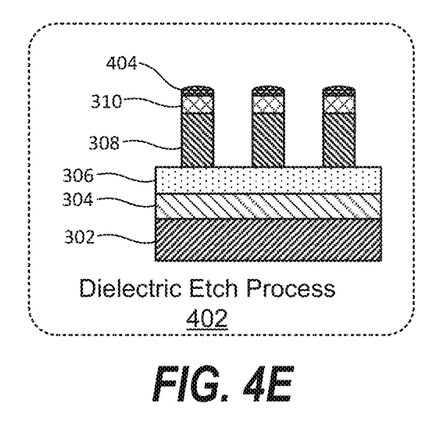
FIG. 4E is a cross-section diagram illustrating one embodiment a workflow for patterning low aspect ratio stacks.

In the process step of FIG. 4C, the organic layer 310 may be etched in a region exposed by the patterned anti-reflective layer 312 to form a patterned feature therein. In one embodiment, the anti-reflective layer 312 may be removed in the processing step illustrated in FIG. 4D.

In an embodiment, the dielectric layer 308 may be etched in a region exposed by the organic layer 310 to form a patterned feature therein. In a low aspect ratio stack 320, such as the one received in the step of FIG. 4A, traditional etch methods may not be sufficient to adequately etch the dielectric layer 308 without significant degradation of the patterned features, including LER and line wiggle anomalies. One reason for the degradation is that the organic layer 310 may not have a sufficient thickness to withstand the total etch duration required to etch the dielectric layer 308, and may be prematurely removed. Consequently, the organic layer 310 in a low aspect ratio stack may be insufficient to adequately mask the dielectric layer 308 during the etch process of FIG. 4E.

A dielectric etch process 402, in which a capping material 404 is deposited on the patterned surfaces of the organic layer 310 may be used to enhance the fidelity of the etched features in the dielectric layer 308. One such dielectric etch process is illustrated in FIG. 5.

Figure 5:
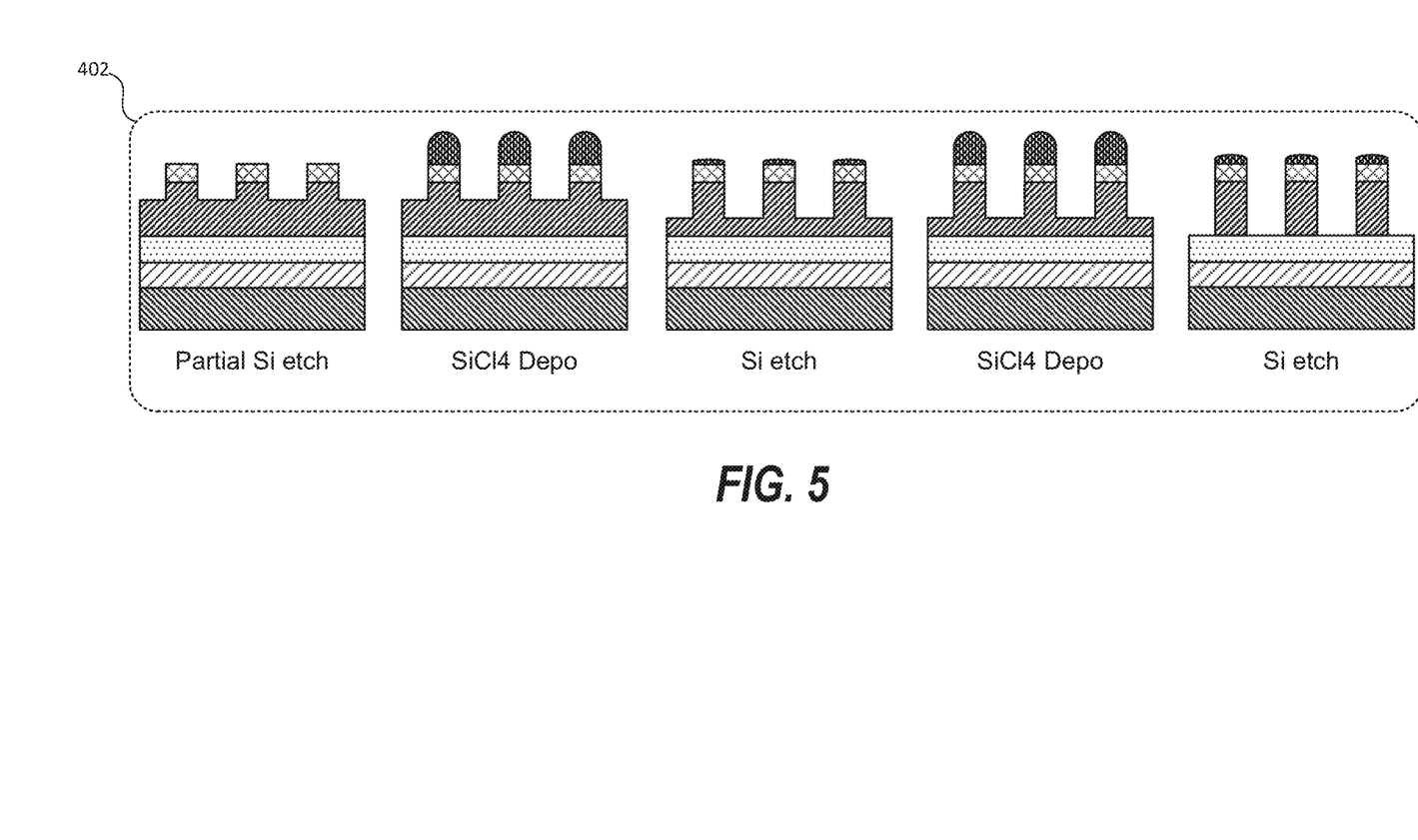
FIG. 5 is a cross-section diagram illustrating one embodiment of a silicon etch process in a workflow for patterning low aspect ratio stacks.

The embodiment of the dielectric etch process 402 illustrated in FIG. 5 includes a plurality of cyclical iterations. In a first step, the dielectric layer 308 is partially etched with the organic layer 310 as a mask. In a second step, a layer of capping material 404 is deposited on a patterned surface of the organic layer 308. In a third step, the dielectric etch is resumed until the capping material 404 is partially or completely depleted. The capping material 404 is redeposited, and the cycle continues for a number of iterations that causes the dielectric layer 308 to be etched to a required depth and to specified quality requirements.

In an embodiment, the capping material 404 may be silicon tetrachloride (SiCl$_4$). The capping material 404 may be deposited using an in-situ plasma assisted deposition technique. In such an embodiment, a deposition process may be performed in a plasma chamber 110 as illustrated in the system of FIG. 1. In an embodiment, the process may be performed at a chamber pressure in a range of 8 mT to 12 mT. In such an embodiment, source power in a range of 425 W to 575 W may be applied. In one embodiment, the process may be performed without applying bias power. It may be useful to avoid applying bias power, or to apply relatively low bias power, so that the capping material 404 deposits primarily on the patterned surfaces of the organic layer, and relatively little on the surfaces of the dielectric layer 308. In one such embodiment, there may be at least one order of magnitude difference between the amount of capping material deposited on the patterned surface of the organic layer and the surfaces of the dielectric layer.

In such embodiments, capping material 404 may be deposited using a plasma that includes SiCl4 gas introduced to the chamber 110 at a flow rate in a range of 15 sccm to 20 sccm. The temperature in the processing chamber 110 may be in a range of 15° C. to 25° C.

Figure 6A:
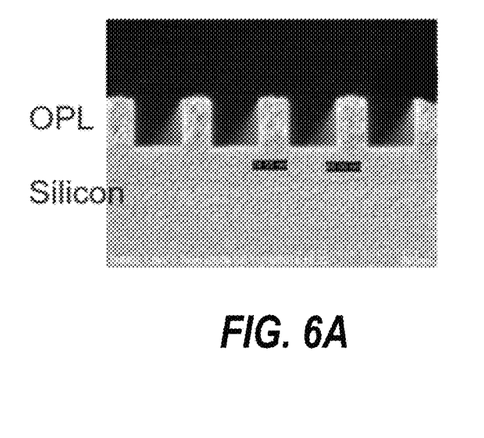
FIG. 6A is an image showing a cross-section of a feature etched in an OPL layer as a result of a process for patterning low aspect ratio stacks.
Figure 6B:
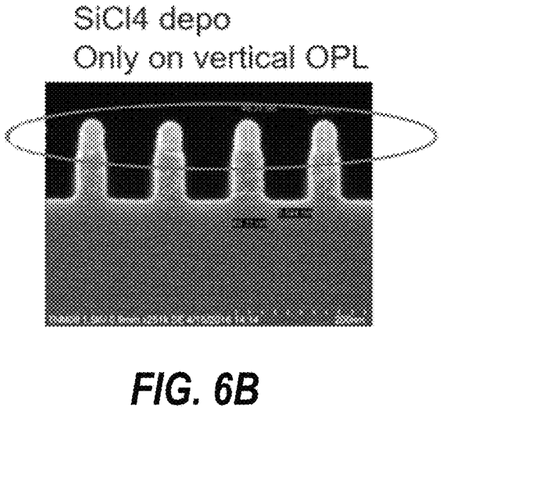
FIG. 6B is an image showing a cross-section of a deposit of a capping material on a feature etched in an OPL layer as a result of a process for patterning low aspect ratio stacks.

FIGS. 6A and 6B show image taken of a cross-section of test features without the capping material deposited and with the capping material deposited, respectively. As shown, the present embodiments may primarily deposit the capping material on the patterned surfaces of the organic layer 310. For example, in the result of FIG. 6B, the capping material was deposited on a horizontal surface of a patterned feature in the OPL layer extending from a surface of the dielectric layer. In one embodiment, the capping material is deposited primarily on the horizontal surface of the OPL layer using a material selective deposition process. In another embodiment, the capping material is deposited primarily on the horizontal surface of the OPL layer as a result of the aspect ratio between the horizontal surface of the OPL layer and the depth of the feature formed in the dielectric layer.

Such embodiments may be used in conjunction with various semiconductor device processing techniques, including for example, Extreme UltraViolet (EUV) lithography processes and the like. Such embodiments may be useful for formation of features having critical dimensions as low as the range of 30 nm to 50 nm.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for patterning of a low aspect ratio stack, comprising:
    receiving a substrate comprising a patterned organic planarizing layer (OPL) mask wherein a surface of the OPL mask is exposed, the OPL mask landing on a dielectric layer;
    performing a partial etch of the dielectric layer in a region exposed by the OPL mask;
    depositing a capping material on a surface of the OPL mask; and
    performing a cyclical process of the partial etch of the dielectric layer and deposition of the capping material on a surface of the OPL mask until the dielectric layer is removed to a target depth;

wherein the cyclical process generates an output patterned substrate with a target line edge roughness (LER).

2. The method of claim 1, wherein depositing the capping material on the surface of the OPL mask further comprises depositing a layer of silicon tetrachloride ($SiCl_4$) material.

3. The method of claim 2, wherein depositing the layer of $SiCl_4$ comprises performing an in-situ plasma-assisted deposition process.

4. The method of claim 3, wherein the plasma-assisted deposition process is performed at a chamber pressure in a range of 8 mT or 12 mT.

5. The method of claim 3, wherein the plasma-assisted deposition process is performed at a source power in a range of 425 W to 575 W.

6. The method of claim 3, wherein the plasma-assisted deposition process is performed without power applied to a bias source.

7. The method of claim 3, wherein the plasma-assisted deposition process is performed with SiCl4 gas at a flow rate in a range of 15 sccm to 20 sccm.

8. The method of claim 3, wherein the plasma-assisted deposition process is performed at a temperature in a range of 15° C. to 25° C.

9. The method of claim 1, wherein the capping material is deposited primarily on a horizontal surface of a patterned feature in the OPL layer extending from a surface of the dielectric layer.

10. The method of claim 9, wherein the capping material is deposited primarily on the horizontal surface of the patterned feature in the OPL layer using a material selective deposition process.

11. The method of claim 9, wherein the capping material is deposited primarily on the horizontal surface of the patterned feature in the OPL layer as a result of the aspect ratio between the horizontal surface of the OPL layer and the depth of the feature formed in the dielectric layer.

12. The method of claim 9, wherein the quantity of capping material deposited on the horizontal surface of the patterned feature is at least one order of magnitude greater than a quantity of capping material deposited on a surface of the dielectric layer exposed by the patterned OPL layer.

13. The method of claim 1, wherein the OPL layer has a thickness in a range of 40 nm to 60 nm.

14. The method of claim 1, wherein the OPL layer has a thickness in a range of 30 nm to 40 nm.

15. The method of claim 1, wherein the OPL layer is patterned in regions defined by a patterned anti-reflective coating disposed on a surface of the OPL layer.

16. The method of claim 15, wherein the anti-reflective coating comprises a Silicon Anti-Reflective Coating (SiARC).

17. The method of claim 16, wherein the SiARC layer has a thickness in a range of 10 nm to 25 nm.

18. The method of claim 1, performed in conjunction with an Extreme Ultraviolet (EUV) lithography process.

19. The method of claim 1, wherein a Critical Dimension (CD) of a feature formed in the dielectric layer is in a range of 30 nm to 50 nm.

20. The method of claim 1, wherein the target line edge roughness (LER) is in a range of 1.5 nm to 2.1 nm.

\* \* \* \* \*